United States Patent [19]

Sugibayashi

[11] Patent Number: 5,327,102

[45] Date of Patent: Jul. 5, 1994

[54] SOUND RECORDING APPARATUS

[75] Inventor: Hideaki Sugibayashi, Kyoto, Japan

[73] Assignee: Rohm Co., Ltd., Kyoto, Japan

[21] Appl. No.: 957,553

[22] Filed: Oct. 8, 1992

[30] Foreign Application Priority Data

Oct. 9, 1991 [JP] Japan .................................. 3-290967
Aug. 3, 1992 [JP] Japan .................................. 4-206598

[51] Int. Cl.[5] .................................. H03F 3/191
[52] U.S. Cl. .................................. 330/304; 333/28 T; 381/103
[58] Field of Search ............ 330/304, 305; 333/28 R, 333/28 T; 381/103

[56] References Cited

U.S. PATENT DOCUMENTS 4,046,960 9/1977 Veale .................................. 333/28 T X
4,996,497 2/1991 Waehner .................................. 330/304 X Primary Examiner—Steven Mottola
Attorney, Agent, or Firm—Nikaido, Marmelstein, Murray & Oram

[57] ABSTRACT

A sound recording apparatus for equalizing a sound signal before the sound signal is recorded onto a recording medium includes an amplifier to which the sound signal is inputted and a simulated inductor circuit connected to the amplifier. The simulated inductor circuit includes a buffer whose input side is coupled to a predetermined bias, a plurality of capacitors for connecting the output side of the buffer to the amplifier, and a switch for changing an equalizing characteristic by changing over a capacitor among the plurality of capacitors.

2 Claims, 3 Drawing Sheets

SOUND RECORDING APPARATUS

BACKGROUND OF THE INVENTION

1. Field of the Invention

The present invention relates to a sound recording apparatus, and more particularly, to a recording apparatus for recording a standard sound signal for use in a video cassette recorder (VCR).

2. Description of the Prior Art

In video cassette recorders, a standard sound signal to be recorded onto a sound track is equalized before recorded. The equalizing is performed according to a recording speed mode such as EP (extended play) and SP (standard play) modes.

FIG. 1 shows a conventional circuit where equalizing is performed according to the EP or SP mode as described above. Numeral 1 is an operational amplifier. A sound signal is supplied to a plus input terminal thereof. To a minus input terminal thereof to which a negative feedback is applied through resistors R3 and R4, a first series circuit 2 is connected including an inductance coil L which is a discrete part, a capacitor C11 and a resistor R11 which circuit 2 is arranged between the minus input terminal and ground. To the minus input terminal, a second series circuit 3 is also connected including a capacitor C12, a resistor R12 and a switch 4 which circuit 3 is arranged between ground and a connection midpoint (a) located between the induction coil L and the capacitor C11. In the SP mode, the switch 4 is OFF. As a result, the capacitor C12 and the resistor R12 of the second series circuit 3 do not operate, and only the first series circuit 2 operates. Under this condition, the resonant frequency is, as shown by SP in FIG. 2, a comparatively high frequency f1 in middle and high bands. A gain of the amplifier 1 is boosted with the frequency f1 as the center.

In the EP mode, the switch 4 is ON. As a result, the second series circuit 3 operates in addition to the first series circuit 2. Under this condition, the resonant frequency is a low frequency f2 in the middle and high bands. A gain of the amplifier 1 is boosted with the frequency f2 as the center.

A sound signal is equalized in the above-described manner so that a predetermined band thereof is boosted in each recording speed mode. Thereafter, it is directed to a succeeding circuit (not shown), and is finally recorded onto a sound track of magnetic tape through a magnetic head.

In FIG. 2, the gain is not boosted in a band higher than the middle and high bands. This is because no sound signals are present in such a band of a standard sound signal for a video cassette recorder.

In the conventional circuit, since the discrete inductance coil L is used on the negative feedback side of the amplifier 1, the possibility is strong that noise is produced due to electromagnetic induction caused between the inductance coil L and a surrounding apparatus such as a television receiver.

Furthermore, since the cost of the discrete inductance coil is comparatively high compared to those of a capacitor and a resistor, the cost of the entire circuit increases. In addition, an additional work in manufacturing the VCR is required to connect the induction coil.

SUMMARY OF THE INVENTION

An object of the present invention is to provide a sound recording apparatus where no electromagnetic induction is caused with a surrounding apparatus and which has an equalizing circuit that is low in cost and advantageous in manufacturing.

Another object of the present invention is to provide a sound recording apparatus whose characteristic is easily set and which has an equalizing circuit that is low in cost and advantageous in manufacturing.

To achieve the above-mentioned objects, according to the present invention, a sound recording apparatus for equalizing a sound signal before the sound signal is recorded onto a recording medium, is provided with an amplifier to which the sound signal is inputted, and a simulated inductor circuit connected to the amplifier.

With such a feature, since the simulated inductor circuit which corresponds to the coil used in the conventional circuit is not a coil, no electromagnetic induction is caused even in a case where a surrounding apparatus has a coil which produces a magnetic field. Consequently, noise is hardly picked up from external sources. As a result, a sound signal of high quality can be recorded.

BRIEF DESCRIPTION OF THE DRAWINGS

These and other objects and features of this invention will become clear from the following description, taken in conjunction with the preferred embodiments with reference to the accompanied drawings in which.

DESCRIPTION OF THE PREFERRED EMBODIMENTS

Figure 3:
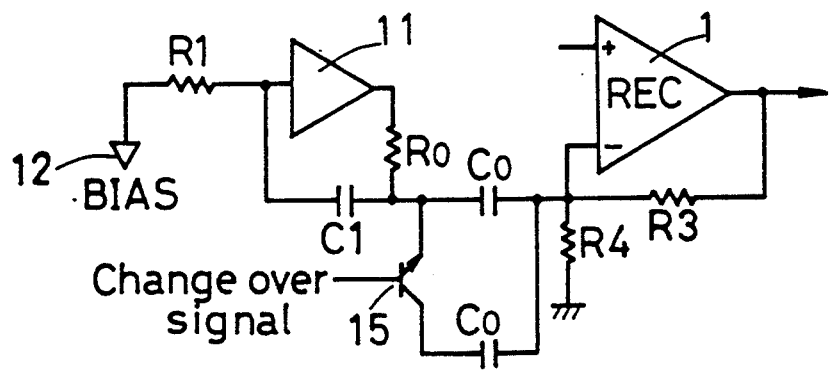
FIG. 3 is a circuit diagram showing an equalizing circuit section of a sound recording apparatus of the present invention.

FIG. 3 shows an equalizing circuit of a sound recording apparatus embodying the present invention. In the circuit, a simulated inductor circuit which is provided in the form of an integrated circuit is used as the inductance. First, the simulated inductor circuit will be described with reference to FIGS. 4 and 5.

Figure 4:
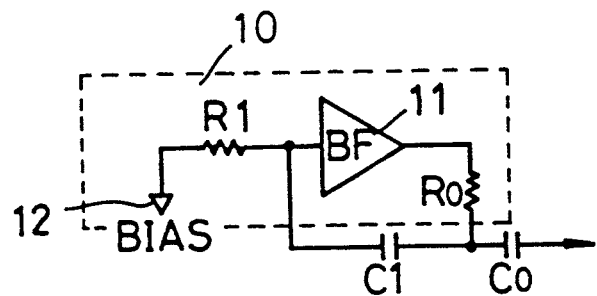
FIG. 4 shows a basic arrangement of a simulated inductor circuit.

A simulated inductor circuit shown in FIG. 4 includes a buffer 11, a resistor R1 which couples the input of the buffer 11 to a bias point 12, and a resistor Ro connected to the output side of the buffer 11. Capacitors C1 and Co are externally attached as shown in the figure. The buffer 11 and the resistors R1 and Ro are formed in an integrated circuit.

Figure 5:
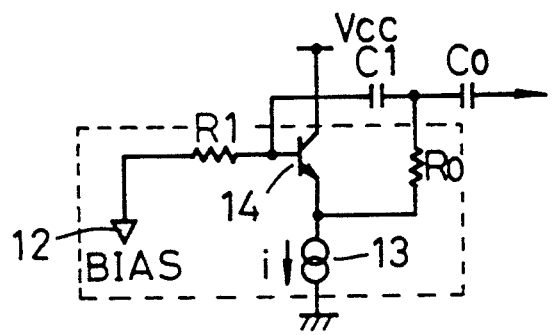
FIG. 5 is a circuit diagram specifically showing a part of the circuit of FIG. 4.

FIG. 5 shows the arrangement of the buffer 11 in detail. The buffer 11 includes an NPN transistor 14 and a constant current source 13 for supplying an emitter current i of the transistor 14. The collector of the transistor 14 is connected to a source voltage Vcc.

Figure 1:
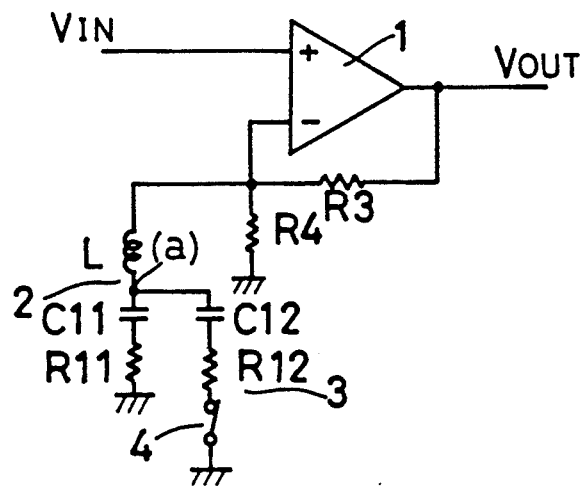
FIG. 1 is a circuit diagram showing an equalizing circuit section of a conventional sound recording apparatus.
Figure 2:
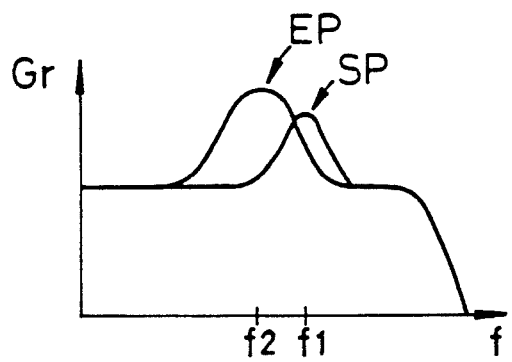
FIG. 2 graphically shows equalizing characteristics in sound recording by a VCR.

Returning to FIG. 3, the simulated inductor circuit is connected through the capacitor Co to the minus input terminal of the operational amplifier 1 which has been explained with reference to FIG. 1. A capacitor Co' is provided in parallel to the capacitor Co. A switching transistor is provided for controlling ON/OFF of the capacitor Co' according to a recording speed mode. To the base of the switching transistor 15, a high-level voltage is provided in the EP mode, and a low-level voltage is provided in the SP mode. As a result, equalizing characteristics shown in FIG. 2 are obtained. In FIG. 3, all the parts but the capacitors Co and Co' can be provided in the form of an integrated circuit.

As described above, according to this embodiment, the simulated inductor circuit, which corresponds to a coil provided in a conventional sound recording apparatus, is hardly subjected to an electromagnetic induction even in a case where a surrounding apparatus has a coil which produces a magnetic field, since the simulated inductor is not a coil. Consequently, since noise is hardly picked up from external sources, a sound signal of high quality can be recorded. Furthermore, the sound recording apparatus according to this embodiment is advantageous in manufacturing since it is low in cost compared to a conventional one where a coil is used as a discrete part and since it can be provided in the form of an integrated circuit.

Figure 6:
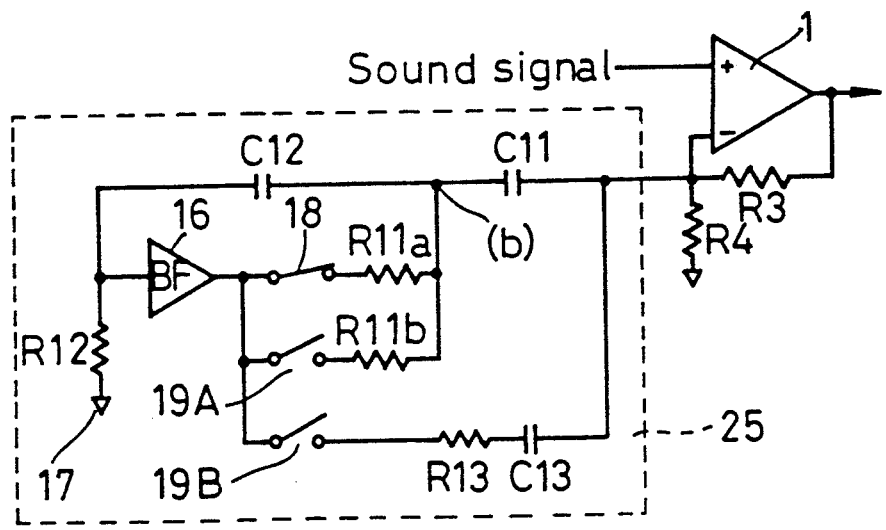
FIG. 6 is a circuit diagram showing an equalizing circuit section in a second embodiment of the present invention.

Subsequently, a second embodiment shown in FIG. 6 will be described.

In this embodiment, in order to perform equalizing according to a recording speed mode such as the EP and SP modes, a simulated inductor circuit 25 is connected to a minus input terminal of an operational amplifier 1 to which a negative feedback is applied through resistors R3 and R4 from the output side.

The simulated inductor circuit 25 includes: a buffer 16; a resistor R12 which connects the input side of the buffer to a bias point 17; a first switch 18 and second switches 19A and 19B provided at the output side of the buffer 16 and turned on in the SP and EP modes, respectively; a resistor R11a connected to the output side of the buffer 16 when the first switch 18 is ON; a resistor R11b connected to the output side of the buffer 16 when the second switch 19A is ON; a capacitor C11 which constitutes a series circuit together with the resistor R11a or R11b and connects the output side of the buffer 16 to the minus input terminal of the operational amplifier 1; a capacitor C12 connected between a connection midpoint (b) of the capacitor C11 and the resistor R11a or R11b, and the input side of the buffer 16; and an impedance network (a resistor R13 and a capacitor C13 in this case) connected in parallel with the series circuit consisting of the resistor R11b and the capacitor C11 when the second switch 19B is ON.

In the SP mode, the first switch 18 is ON, and the second switches 19A and 19B are OFF, so that the resistor R11a is connected to the output side of the buffer 16. As a result, the resistor R11a operates as a series circuit together with the capacitor C11. Under this condition, a resonant frequency f11 is decided by the resistors R11a and R12 and the capacitors C11 and C12, and a gain of the operational amplifier 1 is boosted with the resonant frequency f11 as the center. As a result, an equalizing characteristic optimal for the SP mode is obtained. That is, the resonant frequency f11 is $$f11 = \frac{1}{2\pi \sqrt{R11aR12C11C12}} (Hz).$$

A quality factor Q1 of a resonance and a gain Gv11 thereof are $$Q1 = \sqrt{\frac{R12C12}{R11aC11}}, \text{ and}$$

$$Gv11 = 20\log\left(\frac{Z11 + R3}{Z11}\right)(dB),$$

where $$Z11 = R4 // \left(\frac{1}{\omega C11} + R11a + \omega R11aR12C12\right).$$

In the EP mode, the first switch 8 is OFF and the second switches 9A and 9B are ON, so that the resistors R11b and R13 and the capacitor C13 are connected to the output side of the buffer 16. As a result, the resistor R11b operates as the series circuit together with the capacitor C11, and in parallel with the series circuit, the series circuit consisting of the resistor R13 and the capacitor C13 operate.

Under this condition, a resonant frequency f12 is decided by the resistor R11b. That is, the resonant frequency f12 is $$f12 = \frac{1}{2\pi \sqrt{R11bR12C11C12}} (Hz).$$

Figure 7:
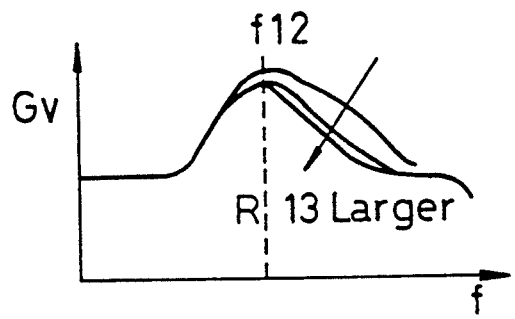
FIG. 7 graphically shows equalizing characteristics of the circuit of FIG. 6 with respect to variation of a resistor R13.
Figure 8:
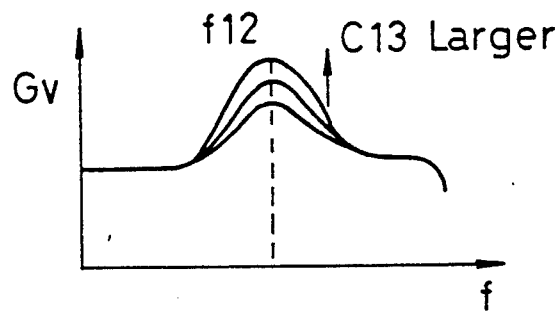
FIG. 8 graphically shows equalizing characteristics of the circuit of FIG. 7 with respect to variation of a capacitor C13.

A gain of the operational amplifier is boosted with the resonant frequency f12 as the center. At this time, since a quality factor Q2 of a resonance in the vicinity of f12 can be acuminated by increasing the resistor R13 (see FIG. 7) and since a gain Gv12 in the vicinity of f12 can be increased by increasing the capacitor C13 (see FIG. 8), the quality factor Q2 and the gain Gv12 can be set without the resonant frequency f12 being changed. As a result, an equalizing characteristic optimal for the EP mode can be obtained. A gain Gv obtained at a predetermined portion other than a boosted band portion is $$Gv = 20\log\left(\frac{R3 + R4}{R4}\right)(dB).$$

Figure 9:
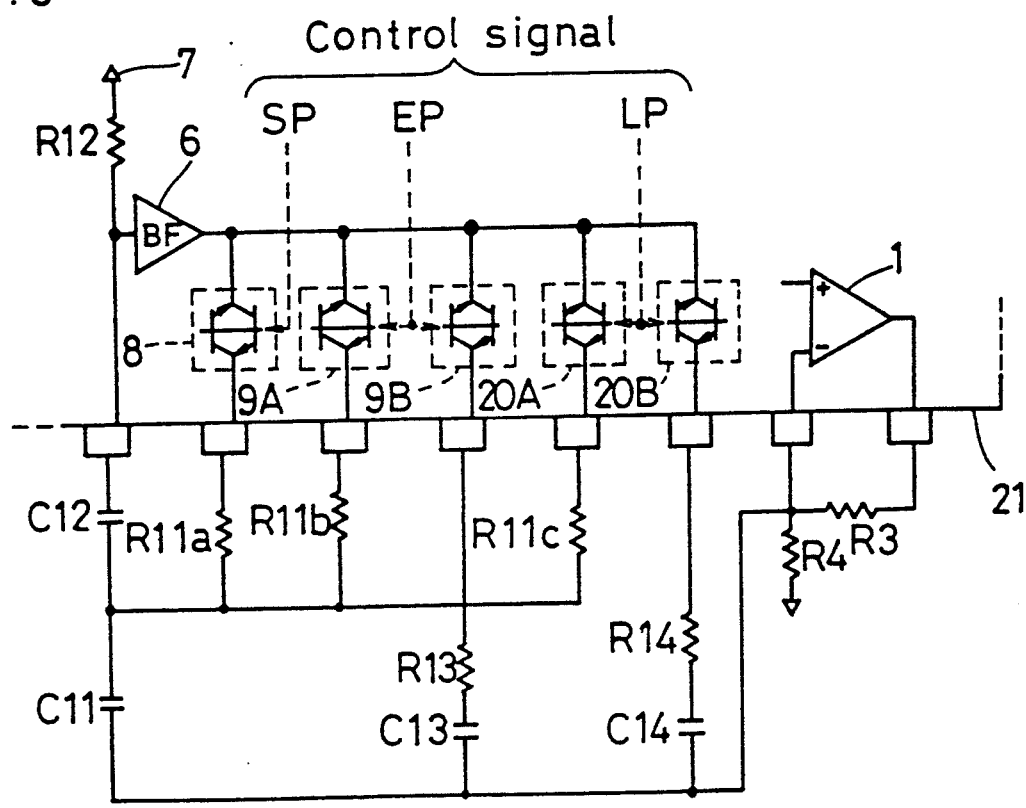
FIG. 9 is a circuit diagram showing a specific example of the circuit of FIG. 6.

FIG. 9 specifically shows an embodiment where a buffer 16 and first, second and third switches 18, 19A and 19B, and 20A and 20B corresponding to the SP, EP and LP (long play) modes, respectively, are provided together with an operational amplifier 1 in a semiconductor integrated circuit (hereinafter referred to as IC) 21. Since the switches are arranged on the output side of the buffer 16, analog switches which are suitable for being provided in the form of an IC (in this case, transistors of a complementary connection configuration as shown in the figure) are used as the switches 18, 19A, 19B, 20A and 20B. A high-level control signal is provided to the base of each of the transistors in according to the mode.

With this arrangement, in the SP mode, only the first switch 18 is ON in the IC 21 in response to the control signal, so that an equalizing characteristic optimal for the SP mode can be set based on the resonant frequency f11, the quality factor Q1 and the gain Gv11 obtained at that time.

In the EP mode, only the second switches 19A and 19B are ON in the IC 21 in response to the control signal, so that an equalizing characteristic optimal of the EP mode can be set based on the resistors R11b and R13 and the capacitor C13. That is, the resonance frequency f12 is set by the resistor R11b, and the quality factor Q2 and the gain Gv12 are set by the resistor R13 and the capacitor C13 without the resonant frequency f12 being changed.

In the LP mode, only the third switches 20A and 20B are ON in the IC 21 in response to the control signal, an equalizing characteristic optimal for the LP mode can be obtained based on resistors R11c and R14 and a capacitor C14. That is, a resonant frequency f13 is set by the resistor R11c, and a quality factor Q3 of a resonance and a gain Gv13 are set by the resistor R14 and the capacitor C14 without the resonant frequency f13 being changed.

According to the above-described second embodiment, the simulated inductor circuit, which corresponds to a coil provided in a conventional sound recording apparatus, is hardly subjected to an electromagnetic induction even in a case where a surrounding apparatus has a coil which produces a magnetic field, since the simulated inductor is not a coil. Consequently, since noise is hardly picked up from external sources in performing equalizing, a sound signal of high quality can be recorded. Furthermore, since its equalizing characteristic can easily be set and since it is low in cost compared to a conventional one where a coil is used as a discrete part and can be provided in the form of an integrated circuit, the sound recording apparatus according to the second embodiment is advantageous in manufacturing.

Obviously, many modifications and variations of the present invention are possible in light of the above teachings. It is therefore to be understood that within the scope of the appended claims, the invention may be practiced other than as specifically described.

What is claimed is:

1. A sound recording apparatus for equalizing a sound signal before the sound signal is recorded onto a recording medium, comprising:

an amplifier to which the sound signal is inputted; and a simulated inductor circuit connected to the amplifier said simulated inductor circuit including a buffer whose input side is coupled to a predetermined bias; a plurality of capacitors for connecting the output side of the buffer to the amplifier; and switch means for changing an equalizing characteristic by changing a selected capacitance by switching among the plurality of capacitors.

2. A sound recording apparatus for equalizing a sound signal before the sound signal is recorded onto a recording medium, comprising:

an amplifier to which the sound signal is inputted; and a simulated inductor circuit connected to the amplifier, the simulated inductor circuit including:

a buffer whose input side is coupled to a predetermined bias;

a series circuit consisting of a resistor and a capacitor for connecting the output side of the buffer to the amplifier;

an impedance network connected parallel with the series circuit; and switch means for changing an equalizing characteristic by switching between the series circuit and the impedance network on the output side of the buffer.

* * * * *